United States Patent
Balakrishnan et al.

(10) Patent No.: US 9,923,737 B2
(45) Date of Patent: Mar. 20, 2018

(54) ANALOG-DIGITAL COMPATIBLE RE-SAMPLING

(71) Applicant: TEXAS INSTRUMENTS INCORPORATED, Dallas, TX (US)

(72) Inventors: Jaiganesh Balakrishnan, Bangalore (IN); Jawaharlal Tangudu, Bangalore (IN); Sreenath Narayanan Potty, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/246,248

(22) Filed: Aug. 24, 2016

(65) Prior Publication Data
US 2017/0063575 A1    Mar. 2, 2017

(30) Foreign Application Priority Data
Aug. 24, 2015   (IN) ............................ 4410/CHE/2015

(51) Int. Cl.
| | |
|---|---|
| H04L 27/14 | (2006.01) |
| H03K 9/00 | (2006.01) |
| H04L 25/03 | (2006.01) |
| H04L 12/741 | (2013.01) |
| H04L 12/26 | (2006.01) |

(52) U.S. Cl.
CPC ...... *H04L 25/03006* (2013.01); *H04L 43/022* (2013.01); *H04L 45/745* (2013.01)

(58) Field of Classification Search
USPC ....... 375/219, 220, 221, 222, 229–236, 240, 375/240.26–240.29, 285, 284, 278, 286, 375/290, 295, 316, 346, 340, 324
See application file for complete search history.

(56) References Cited

U.S. PATENT DOCUMENTS

| | | | |
|---|---|---|---|
| 8,416,844 B2* | 4/2013 | Ouchi ................. | H04L 25/0232 375/229 |
| 2002/0078114 A1* | 6/2002 | Wang ................. | H03H 17/0664 708/313 |
| 2003/0165202 A1* | 9/2003 | Park ...................... | H03D 3/007 375/324 |

(Continued)

OTHER PUBLICATIONS

Crochiere et al., "Interpolation and Decimation of Digital Signals—A Tutorial Review," Proceedings of the IEEE, vol. 69, No. 3, Mar. 1981, pp. 300-331.

(Continued)

*Primary Examiner* — Linda Wong
(74) *Attorney, Agent, or Firm* — William B. Kempler; Charles A. Brill; Frank D. Cimino

(57) ABSTRACT

A re-sampler comprises: a plurality of multipliers configured to receive an input sample; and a plurality of accumulators coupled to the multipliers and configured to form multiplier-accumulator (MAC) units with the multipliers, wherein the MAC units are configured to: compute partial products from the input sample, accumulate the partial products over clock cycles, and sequentially generate output samples based on the computing and the accumulating. A method comprises: receiving input samples; computing partial products from the input samples; accumulating the partial products over clock cycles; and sequentially generating output samples based on the computing and the accumulating.

17 Claims, 7 Drawing Sheets

(56) References Cited

U.S. PATENT DOCUMENTS

| | | | | |
|---|---|---|---|---|
| 2005/0193047 A1* | 9/2005 | Fu | .......................... | H04L 27/22 |
| | | | | 708/300 |
| 2006/0103555 A1* | 5/2006 | Antonesei | .......... | H03H 17/0275 |
| | | | | 341/61 |
| 2006/0181797 A1* | 8/2006 | Sugawara | ................ | G11B 5/09 |
| | | | | 360/51 |
| 2013/0294549 A1* | 11/2013 | Sun | ........................ | G01S 19/24 |
| | | | | 375/340 |
| 2015/0162896 A1* | 6/2015 | Kayama | ............. | H03H 17/0283 |
| | | | | 708/301 |
| 2015/0171890 A1* | 6/2015 | Pagnanelli | ............ | H03M 3/468 |
| | | | | 341/143 |
| 2016/0050024 A1* | 2/2016 | Kaneda | ............. | H04B 10/2575 |
| | | | | 398/208 |

OTHER PUBLICATIONS

Petrov et al., "A Scalable Resampling Architecture," IEEE Communications Society subject matter experts for publication in the IEEE GLOBECOM 2007 proceedings, pp. 3102-3106.

* cited by examiner

| INPUT INDEX | m-7 | m-6 | m-5 | m-4 | m-3 | m-2 | m-1 | m | m+1 | m+2 | m+3 | m+4 | m+5 | m+6 | m+7 | m+8 | m+9 | ∘∘∘ |
|---|---|---|---|---|---|---|---|---|---|---|---|---|---|---|---|---|---|---|
| MULTIPLIER 1 | 56 | 48 | 40 | 32 | 24 | 16 | 8 | 0 | 55 | 47 | 39 | 31 | 23 | 15 | 7 | 62 | 54 | ∘∘∘ |
| MULTIPLIER 2 | | 57 | 49 | 41 | 33 | 25 | 17 | 9 | 1 | 56 | 48 | 40 | 32 | 24 | 16 | 8 | 0 | ∘∘∘ |
| MULTIPLIER 3 | | | 58 | 50 | 42 | 34 | 26 | 18 | 10 | 2 | 57 | 49 | 41 | 33 | 25 | 17 | 9 | ∘∘∘ |
| MULTIPLIER 4 | | | | 59 | 51 | 43 | 35 | 27 | 19 | 11 | 3 | 58 | 50 | 42 | 34 | 26 | 18 | ∘∘∘ |
| MULTIPLIER 5 | | | | | 60 | 52 | 44 | 36 | 28 | 20 | 12 | 4 | 59 | 51 | 43 | 35 | 27 | ∘∘∘ |
| MULTIPLIER 6 | | | | | | 61 | 53 | 45 | 37 | 29 | 21 | 13 | 5 | 60 | 52 | 44 | 36 | ∘∘∘ |
| MULTIPLIER 7 | | | | | | | 62 | 54 | 46 | 38 | 30 | 22 | 14 | 6 | 61 | 53 | 45 | ∘∘∘ |
| OUTPUT INDEX | | | | | | | | n | n+1 | n+2 | n+3 | n+4 | n+5 | n+6 | n+7 | | | ∘∘∘ |

FIG. 4

| INPUT INDEX | m-7 | m-6 | m-5 | m-4 | m-3 | m-2 | m-1 | m | m+1 | m+2 | m+3 | m+4 | m+5 | m+6 | m+7 | m+8 | m+9 | ○ ○ ○ |
|---|---|---|---|---|---|---|---|---|---|---|---|---|---|---|---|---|---|---|
| MULTIPLIER 1 | 56 | 57 | 58 | 59 | 60 | 61 | 62 | 54 | 55 | 56 | 57 | 58 | 59 | 60 | 61 | 62 | 54 | ○ ○ ○ |
| MULTIPLIER 2 | | 48 | 49 | 50 | 51 | 52 | 53 | 45 | 46 | 47 | 48 | 49 | 50 | 51 | 52 | 53 | 45 | ○ ○ ○ |
| MULTIPLIER 3 | | | 40 | 41 | 42 | 43 | 44 | 36 | 37 | 38 | 39 | 40 | 41 | 42 | 43 | 44 | 36 | ○ ○ ○ |
| MULTIPLIER 4 | | | | 32 | 33 | 34 | 35 | 27 | 28 | 29 | 30 | 31 | 32 | 33 | 34 | 35 | 27 | ○ ○ ○ |
| MULTIPLIER 5 | | | | | 24 | 25 | 26 | 18 | 19 | 20 | 21 | 22 | 23 | 24 | 25 | 26 | 18 | ○ ○ ○ |
| MULTIPLIER 6 | | | | | | 16 | 17 | 9 | 10 | 11 | 12 | 13 | 14 | 15 | 16 | 17 | 9 | ○ ○ ○ |
| MULTIPLIER 7 | | | | | | | 8 | 0 | 1 | 2 | 3 | 4 | 5 | 6 | 7 | 8 | 0 | ○ ○ ○ |
| OUTPUT INDEX | | | | | | | | n | n+1 | n+2 | n+3 | n+4 | n+5 | n+6 | n+7 | | n+8 | |

ANALOG-DIGITAL COMPATIBLE RE-SAMPLING

CROSS-REFERENCE TO RELATED APPLICATIONS

This application claims priority to Indian provisional patent application number 4410/CHE/2015 filed on Aug. 24, 2015 by Texas Instruments Incorporated and titled "Co-Existence Friendly Architecture For M/N Sample Rate Conversion," which is incorporated by reference.

BACKGROUND

Sample-rate conversion (SRC) is the process of changing a sampling rate of a discrete signal to obtain a new discrete representation of the underlying continuous signal. A typical SRC implements a rational re-sampling ratio M/N. M is a first sample rate, for instance an up-sampling rate, and N is a second sample rate, for instance a down-sampling rate. Up-sampling, or interpolation, increases a sampling rate of a signal. Down-sampling, or decimation, decreases the sampling rate of the signal.

Signal chain systems such as communications transceivers and automotive radar receivers use M/N SRC. In those applications, high-performance, RF-sampling ADCs with integrated digital front-ends implement the M/N SRC. In mobile network base stations, the front-ends may change the ADC sampling frequency in a range of, for instance, 2 GHz to 3 GHz depending on the center frequencies of signal bands. That technique prevents second and third harmonic spurs from folding back in to the signal bands. However, interface rates for decimated input signals may be at fixed sample rates, for instance 245.76 MHz, which may necessitate resampling factors of 8/9, 4/5, and 2/3.

SUMMARY

In one embodiment, the disclosure includes a re-sampler comprising: a plurality of multipliers configured to receive an input sample; and a plurality of accumulators coupled to the multipliers and configured to form multiplier-accumulator (MAC) units with the multipliers, wherein the MAC units are configured to: compute partial products from the input sample, accumulate the partial products over clock cycles, and sequentially generate output samples based on the computing and the accumulating.

In another embodiment, the disclosure includes a digital re-sampler comprising: a first multiplier configured to receive input samples; a first accumulator coupled to the first multiplier and configured to form a first multiplier-accumulator (MAC) unit with the first multiplier; a first multiplexer coupled to the first MAC unit and comprising: a first input configured to receive an input of 0, and a second input coupled to the first accumulator; a second multiplier configured to receive the input samples; a second accumulator coupled to the second multiplier and configured to form a second MAC unit with the second multiplier; and a second multiplexer coupled to the second MAC unit and comprising: a third input coupled to the first accumulator, and a fourth input coupled to the second accumulator.

In yet another embodiment, the disclosure includes a method comprising: receiving input samples; computing partial products from the input samples; accumulating the partial products over clock cycles; and sequentially generating output samples based on the computing and the accumulating.

2

BRIEF DESCRIPTION OF THE DRAWINGS

For a detailed description of various examples, reference will now be made to the accompanying drawings in which:
FIG. 4 is a table of coefficient indices for the multipliers in the re-sampler in FIG. 3.
FIG. 6 is a table of coefficient indices for the multipliers in the re-sampler in FIG. 5.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

The following abbreviations, acronyms, and initialisms apply:
ADC: analog-to-digital conversion, analog-to-digital converter
DDC: digital down-converter
FIR: finite impulse response
GHz: gigahertz
I: in-phase
LUT: look-up table
MAC: multiplier-accumulator
MHz: megahertz
MS/s: megasamples per second
Q: quadrature
RF: radio frequency
SRC: sample-rate conversion.

Figure 1:
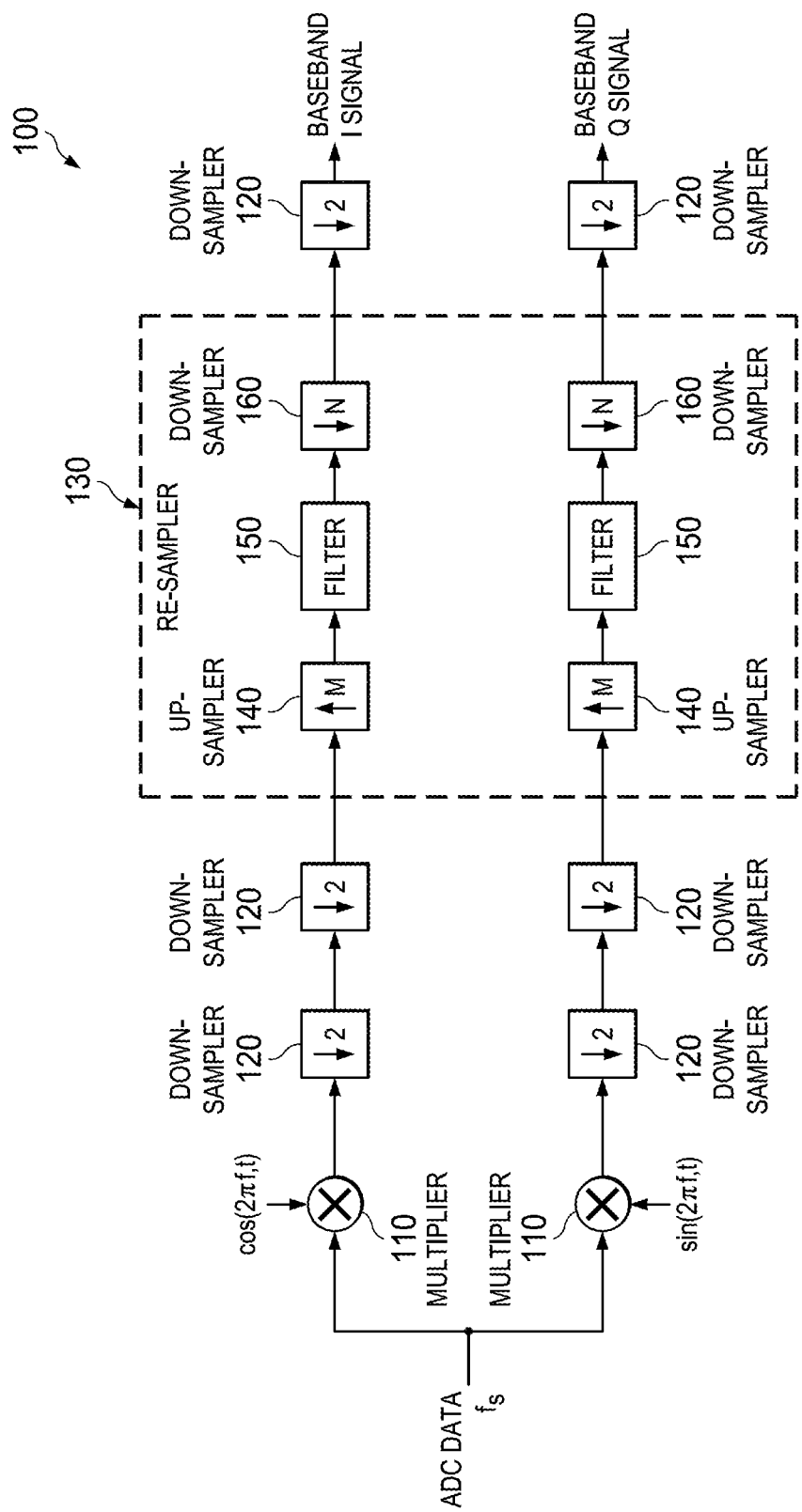
FIG. 1 is a schematic diagram of a DDC.

FIG. 1 is a schematic diagram of a DDC 100. The DDC 100 comprises multipliers 110, down-samplers 120, and a re-sampler 130. The down-samplers 120 may have a down-sampling rate of 2. The DDC 100 comprises a top branch for a baseband I signal and a bottom branch for a baseband Q signal. The re-sampler 130 comprises up-samplers 140, filters 150, and down-samplers 160. The re-sampler 130 may be referred to as an M/N re-sampler because it comprises the up-samplers 140, which may have an up-sampling rate of M, and comprises the down-samplers 160, which may have a down-sampling rate of N, which combine to form an M/N resampling ratio.

The DDC 100 may couple to an output of an ADC, which may perform RF sampling. From the ADC, the DDC 100 may receive ADC data in the form of digital samples at a sampling rate of $f_s$. The DDC 100 extracts a desired signal centered at a frequency $f_c$, down-samples the signal to a lower output sampling rate, and filters out unwanted signals that may fold back in to the desired band during down-sampling. The DDC 100 outputs the baseband I signal and the baseband Q signal after down-conversion, down-sampling, and filtering.

The re-sampler 130 provides flexibility for the sampling rate $f_s$ for a given baseband sample rate. For instance, the DDC 100 may support a fixed output sample rate of 245.76 MS/s when operating the ADC at different sample rates $f_s$ of 2211.84 MS/s, 2457.6 MS/s, or 2949.12 MS/s by configuring M/N to be 8/9, 4/5 or 2/3, respectively. When the output sample rate is fixed, so is the bandwidth of the desired signal.

The re-sampler 130 performs an SRC by a factor of M/N as follows. First, the up-samplers 140 up-sample the input signals by a factor of M by inserting a 0 between every M input samples. Second, the filters 150 filter out images created by the up-sampling. FIR filters may be used to implement the filters 150. Third, the down-samplers 160 down-sample the filtered signals by a factor of N. The sample rate relationship between the input signals and the output signals of the re-sampler 130 is $$f_{out} = M/N * f_{in}, \quad (1)$$

where $f_{out}$ is an output clock rate of the re-sampler 130, M is the up-sampling rate of the up-samplers 140, N is the down-sampling rate of the down-samplers 160, and $f_{in}$ is an input clock rate of the re-sampler 130.

If the re-sampler 130 receives an input signal x(m) and if the sequence $\{h_0, h_1, \ldots, h_{L-1}\}$ represents the coefficients of the filters 150 with L taps, then the filters 150 compute the up-sampled and interpolated signals as follows:

$$u(Mm+l) = \Sigma_{k=0}^{\lfloor (L-1)/M \rfloor} x(m-k) * h_{Mk+l}, \forall l=0,1,\ldots,M-1 \quad (2)$$

where u is an output signal; M is the up-sampling rate of the up-samplers 140; m is an integer sampling index of the input signal x(m); l is an integer that varies from 0 to M−1 and represents the sampling index of the interpolated and filtered output signal u(Mm+l); $\lfloor \ \rfloor$ represents a floor operation, which computes a nearest integer that is lower than a value of the operand; L is a positive integer number of taps, or coefficients, of the filters 150; k is an integer that varies from 0 to $\lfloor (L-1)/M \rfloor$, represents a delay in the sampling index of x(m) to obtain x(m−k), and is an index of the filter coefficient $h_{Mk+l}$; and h is a tap coefficient. However, because the down-samplers 160 follow the filters 150, it may be sufficient to compute only every $N^{th}$ sample of u(Mm+l) in order to generate the output sample y(n). To compute one output sample, up to $P=\lceil L/M \rceil$ multiplication and accumulation operations may be used. The operations may have different phases l of the filter coefficients. The symbol $\lceil \ \rceil$ represents a ceiling operation, which computes a nearest integer that is higher than a value of the operand.

For the same normalized signal bandwidth with respect to the output sampling rate, the number of taps L scales nearly linearly by a factor of N with the normalized bandwidth of the output signal with respect to the input up-sampled signal. Table 1 provides an example of that nearly linear scaling.

TABLE 1

Example designs of the re-sampler 130

| Re-sampling factor (M/N) | 2/3 | 4/5 | 8/9 |
|---|---|---|---|
| Number of taps (L) | 21 | 35 | 63 |
| Number of multiplications/output samples | 11 | 9 | 8 |

As shown, as the down-sampling rate N increases from 3 to 9, the number of taps L increases from 21 to 63. As also shown, as the down-sampling rate N and the number of taps L increase, the number of multiplications required for every output sample decreases from 11 to 8.

Figure 2:
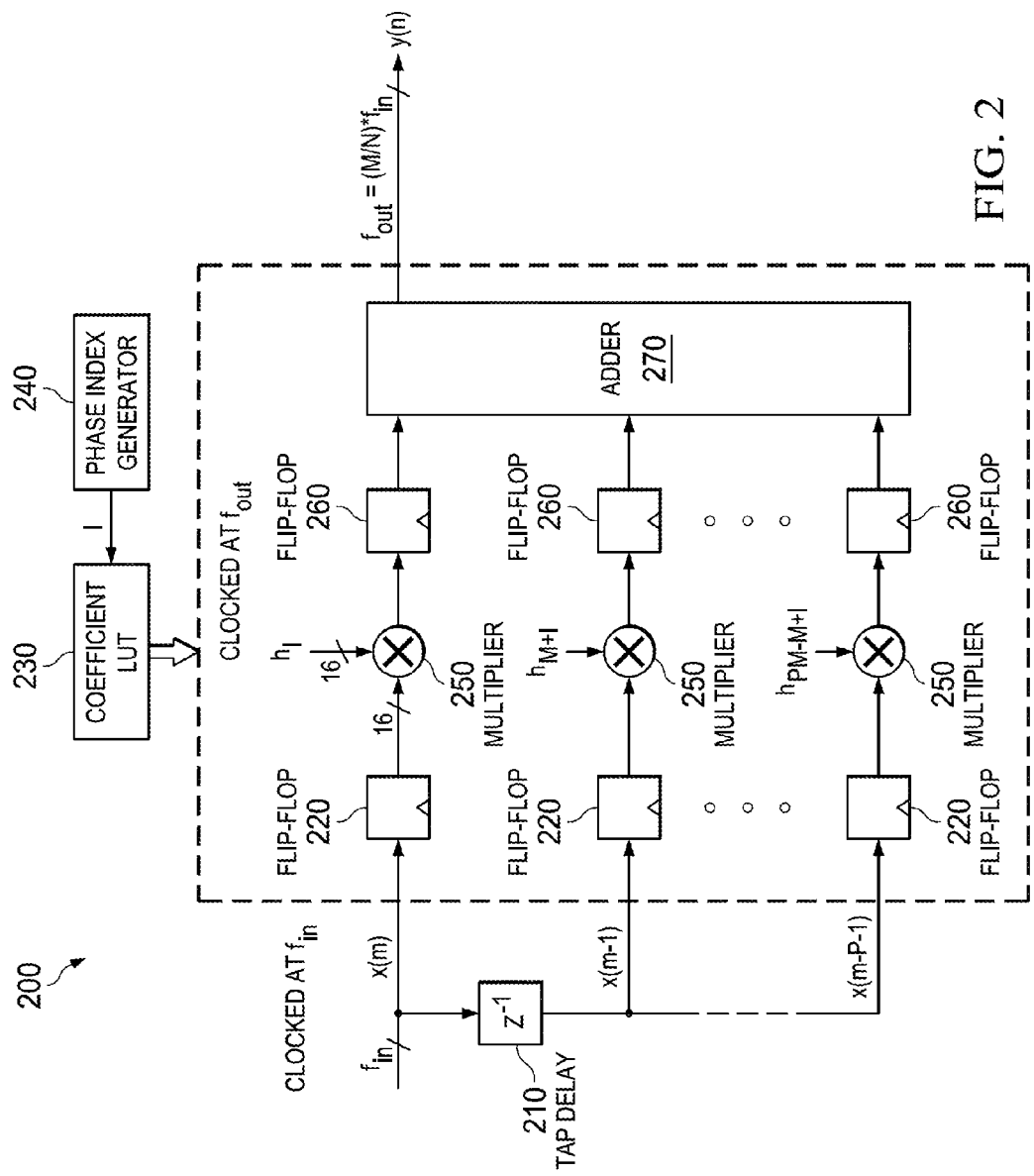
FIG. 2 is a schematic diagram of a re-sampler.

FIG. 2 is a schematic diagram of a re-sampler 200. The re-sampler 200 may implement the re-sampler 130. The re-sampler 200 comprises P tap delays 210 that form a tap delay line, P flip-flops 220, a coefficient LUT 230, a phase index generator 240, P multipliers 250, P flip-flops 260, and a multi-input adder 270. P is a positive integer. The re-sampler 200 has a re-sampling ratio of M/N. The number of multipliers 250 is P, where $P=\lceil L/M \rceil$. Looking at Table 2, for a re-sampling ratio of M/N=2/3, M=2 and L=21. Thus, $\lceil L/M \rceil = \lceil 21/2 \rceil = \lceil 10.5 \rceil = 11$.

In operation, the tap delays 210 store the input samples x(m), . . . , x(m−P−1) at the input clock rate $f_{in}$. Only the tap delays 210 operate at the input clock rate $f_{in}$. The tap delays 210 then transfer the input samples via the flip-flops 220 to the multipliers 250, which operate at the output clock rate $f_{out}$. If fewer multipliers 250 are used for a desired re-sampling ratio, for instance 8 multipliers 250 for a re-sampling ratio of 8/9, then the unused multipliers 250 have a coefficient of 0. The flip-flops 260 latch the outputs of the multipliers 250. The flip-flops 260 are optional and aid in timing closure of the digital logic at high clocking rates. The multipliers 250 and the adder 270 compute a single output y(n). The coefficient LUT 230 stores L coefficients. The re-sampler 200 uses P multiplexers with a size of M:1 to select the coefficients for the multipliers 250. The index I, used to select the coefficients $\{h_I, h_{M+I}, \ldots, h_{PM-M+I}\}$ for the multipliers, takes values from (0, 1, . . . , M−1).

Table 2 shows coefficient indices for the multipliers 250.

TABLE 2

Coefficient indices for the multipliers 250

| Input Index x | m | m + 1 | m + 2 | m + 3 | m + 4 | m + 5 | m + 6 | m + 7 | m + 9 |
|---|---|---|---|---|---|---|---|---|---|
| Multiplier 1 | 0 | 1 | 2 | 3 | 4 | 5 | 6 | 7 | 0 |
| Multiplier 2 | 8 | 9 | 10 | 11 | 12 | 13 | 14 | 15 | 8 |
| Multiplier 3 | 16 | 17 | 18 | 19 | 20 | 21 | 22 | 23 | 16 |
| Multiplier 4 | 24 | 25 | 26 | 27 | 28 | 29 | 30 | 31 | 24 |
| Multiplier 5 | 32 | 33 | 34 | 35 | 36 | 37 | 38 | 39 | 32 |
| Multiplier 6 | 40 | 41 | 42 | 43 | 44 | 45 | 46 | 47 | 40 |
| Multiplier 7 | 48 | 49 | 50 | 51 | 52 | 53 | 54 | 55 | 48 |
| Multiplier 8 | 56 | 57 | 58 | 59 | 60 | 61 | 62 | — | 56 |
| Output Index y | n | n + 1 | n + 2 | n + 3 | n + 4 | n + 5 | n + 6 | n + 7 | n + 8 |

Table 2 assumes L=63 filter coefficients and a re-sampling ratio M/N of 8/9. Thus, P=⌈L/M⌉=⌈63/8⌉=⌈7.875⌉=8, so there are 8 multipliers 250 as denoted by multiplier 1 to multiplier 8. The numbers in the columns correspond to the indices I of the coefficients h that the coefficient LUT 230 provides to the multipliers 250. As the output index y(n), or the output clock, increases from n to n+8, the index I increases from 0 to 7, for instance, and resets to 0 for every 8th output sample index, in other words, at n, n+8, and so on. Each multiplier 250 cycles through the same set of M=8 coefficients, for instance $\{h_0, h_1, \ldots, h_7\}$ for multiplier 1, over N=9 input samples. The re-sampler 200 does not generate output samples y(n) for every Nth (9th) input index, for instance x(m+8). A blank value in Table 2 implies a zero value. For instance, when computing the output sample y(n+7), multiplier 8 receives a zero value as the coefficient.

Analog-digital compatibility, which may be referred to as co-existence, is an important consideration for the DDC 100 and the re-samplers 130, 200 because digital clocks of the re-samplers 130, 200 may couple to analog components in the rest of the DDC 100, introducing spurs and degrading performance. An ADC may adequately handle divided-by-4 or divided-by-8 versions of the input sampling rate $f_s$, for instance $f_s/4$ and $f_s/8$, because the sampling and conversion operations in the ADC occur at those rates. However, the performance of the ADC degrades when there is asynchronous coupling, in other words, when the digital clocks of the re-samplers 130, 200 are at the output clock rate $f_{out}=f_s/4*M/N$. In the re-sampler 200, most of the logic operates at that output clock rate and therefore suffers from the described degradation.

Disclosed herein are embodiments for re-sampling with improved analog-digital compatibility. Specifically, the disclosed re-samplers in which most components are clocked at the input clock rate $f_{in}=f_s/4$ or a divided-by-2 version of the input clock rate $f_{in}$, or $f_s/8$, instead of at the output clock rate $f_{out}$. Furthermore, the multipliers in the disclosed re-samplers may receive, in some examples, only the most recent input samples, and the re-samplers compute partial products across multiple input sampling rates and then accumulate the partial products. This contrasts with re-samplers that have multipliers that receive inputs from tap delays, then compute all partial products in one clock cycle and accumulate the partial products to compute output samples. The disclosed re-samplers comprise P=⌈L/N⌉ multipliers instead of P=⌈L/M⌉ multipliers. In a first embodiment, a streaming MAC re-sampler uses a single MAC to compute all partial products for an output sample and does so across either ⌊L/M⌋ or ⌈L/M⌉ input clock cycles. Each multiplier handles all L filter coefficients, so the streaming MAC re-sampler comprises an L:1 coefficient multiplexer instead of an M:1 coefficient multiplexer. In addition, each multiplier may need to support the filter coefficient with the largest magnitude. In a second embodiment, a ripple-down MAC re-sampler comprises MAC units that sequentially compute partial products for an output sample and also does so across either ⌊L/M⌋ or ⌈L/M⌉ input clock cycles. Each multiplier handles N filter coefficients, so the ripple-down MAC re-sampler comprises an N:1 coefficient multiplexer. As a result, edge multipliers may have relatively less precision for coefficient weighting.

Figure 3:
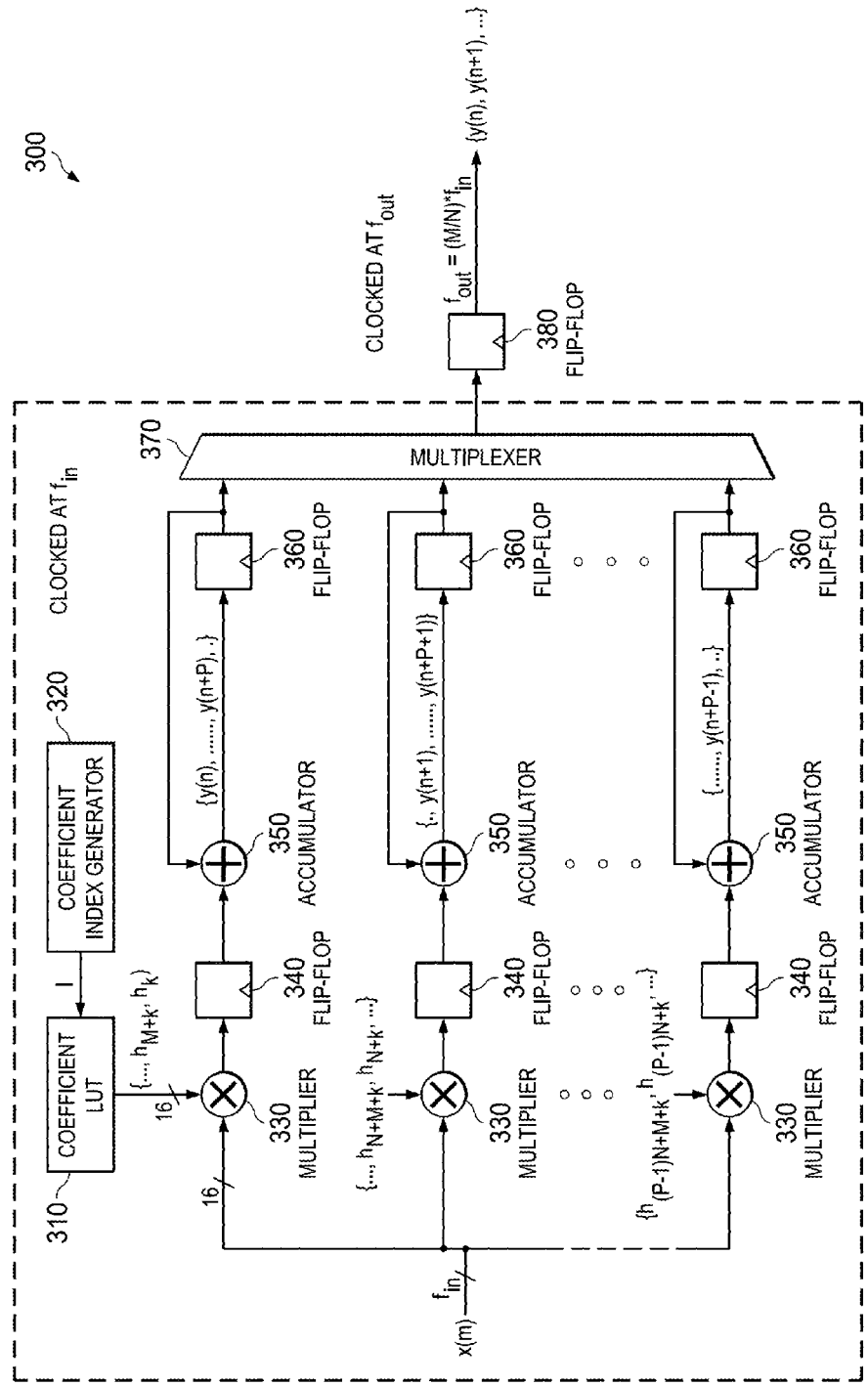
FIG. 3 is a schematic diagram of a re-sampler according to an embodiment of the disclosure.

FIG. 3 is a schematic diagram of a re-sampler 300 according to an embodiment of the disclosure. The re-sampler 300 may implement the re-sampler 130 and may be referred to as a streaming MAC re-sampler. The re-sampler 300 may implement re-sampling in any other application where a sample rate converter logic needs to operate, or clock, at an input sampling rate instead of an output sampling rate. The re-sampler 300 comprises a coefficient LUT 310, a coefficient index generator 320, multipliers 330, flip-flops 340, accumulators 350, flip-flops 360, a multiplexer 370, and a flip-flop 380. If the flip-flops 340, 360, 380 store multiple bits, then they may be referred to as registers.

Each multiplier 330 is coupled to a corresponding accumulator 350. The accumulators 350 may instead be adders. Each pair of the multipliers 330 and the accumulators 350 forms a MAC unit. The MAC units may also comprise the flip-flops 340 between the multipliers 330 and the accumulators 350. The multipliers 330 and the accumulators 350 operate at the input clock rate $f_{in}$ and use only P=⌈L/N⌉ multipliers 330 instead of P=⌈L/M⌉ multipliers. For re-sampling ratios M/N=2/3, 4/5, and 8/9 and numbers of taps L=21, 35, and 63, respectively, P=7. The flip-flops 340, the flip-flops 360, and the multiplexer 370 similarly operate at the input clock rate $f_{in}$. In some examples, only the flip-flop 380, which provides a final output and operates at the equivalent output clock rate $f_{out}$, does not operate at the input clock rate $f_{in}$. As a result, the re-sampler 300 provides improved analog-digital compatibility.

In operation, the input sample x(m) inputs into each of the P multipliers 330. The coefficient LUT 310 stores filter coefficients. The re-sampler 300 uses P multiplexers with a size of L:1 to select the coefficients for the multipliers 330. The multipliers 330 multiply the input sample x(m) by the corresponding filter coefficients. The flip-flops 340 store outputs from the multipliers 330. The flip-flops 340 are optional and aid in timing closure of the digital logic at high clocking rates. The accumulators 350 accumulate the outputs with partial products stored in the flip-flops 360.

The MAC units compute successive output samples in a cyclic manner in either ⌊L/M⌋ or ⌈L/M⌉ input clock cycles. Specifically, one MAC unit performs all MAC operations to compute an output sample, the next MAC unit performs all MAC operations to compute another output sample in the next clock cycle, and so on. For instance, if the first MAC unit computes the output sample y(n) for the $n^{th}$ output sampling index, then the second MAC unit computes the output sample y(n+1) for the $(n+1)^{th}$ sampling index, and so on. Because the MAC units compute the output samples cyclically, the multiplexer 370, which is a P:1 multiplexer, selects the outputs samples from the MAC units and loads the output samples into the flip-flop 380, which provides an output buffer.

FIG. 4 is a table 400 of coefficient indices for the multipliers 330 in the re-sampler 300 in FIG. 3. The table 400 assumes L=63 filter coefficients and a re-sampling ratio M/N=8/9. Thus, P=⌈L/N⌉=⌈63/9⌉=⌈7⌉=7, so there are 7 multipliers 330 as denoted by multiplier 1 to multiplier 7. The numbers in the columns correspond to the indices I of the coefficients h that the coefficient LUT 310 provides to the multipliers 330. The coefficient index generator 320 generates the indices, which periodically take values from 0, 1, . . . , L−1 for each of the multipliers 330 as illustrated in FIG. 4.

The multipliers 330 cycle through the entire set of 63 filter coefficients over L input clock cycles, but in a different order. The re-sampler 300 does not generate output samples y(n) for every 9th input sample index, for instance for the output sample corresponding to the input sample x(m+8). The re-sampler 300 generates output samples using different MAC units over time. For instance, the first MAC unit computes output sample y(n), the second MAC unit computes output sample y(n+1), and so on until the re-sampler 300 cycles back to the first MAC unit to compute output sample y(n+8). Once a MAC unit computes an output sample by adding the partial products across ~L/M input clock cycles, and once the re-sampler 300 passes the output sample through the multiplexer 370 and to the flip flop 380, the flip flop 360 coupled to the MAC unit resets to zero. That ensures that the accumulation of the partial products for the next output sample may begin from an all-zero state.

Figure 5:
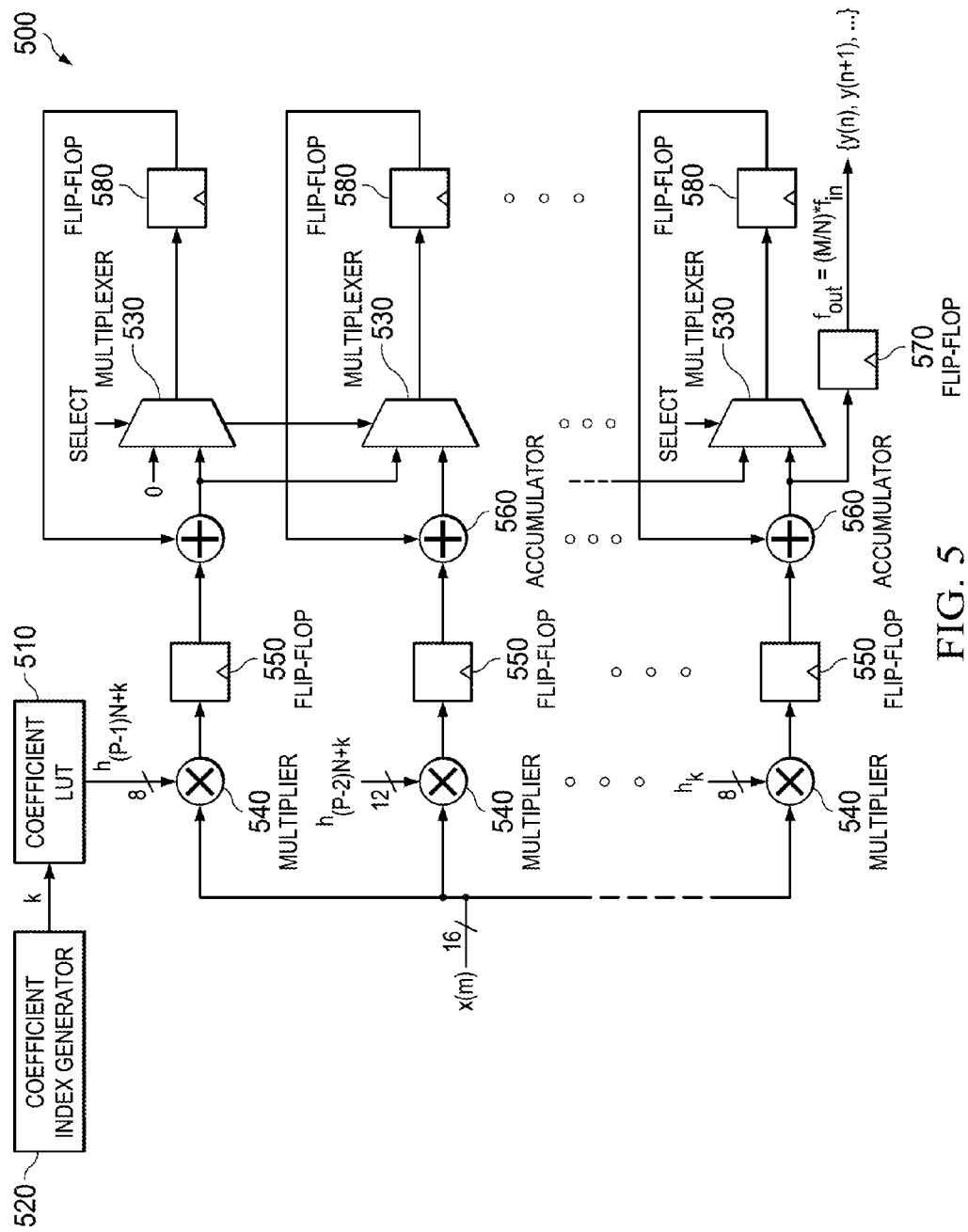
FIG. 5 is a schematic diagram of a re-sampler according to another embodiment of the disclosure.

FIG. 5 is a schematic diagram of a re-sampler 500 according to another embodiment of the disclosure. The re-sampler 500 may implement the re-sampler 130 and may be referred to as a ripple-down MAC re-sampler. The re-sampler 500 may implement re-sampling in any other application where a sample rate converter logic needs to operate, or clock, at an input sampling rate instead of an output sampling rate. The re-sampler 500 comprises a coefficient LUT 510, a coefficient index generator 520, P multiplexers 530, multipliers 540, flip-flops 550, accumulators 560, a flip-flop 570, and flip-flops 580. Unlike the re-sampler 300, which uses P instances of L:1 multiplexers to select the coefficients for the multipliers 250, the re-sampler 500 uses P instances of N:1 multiplexers to select the coefficients for the multipliers 540.

In operation, the multiplexers 530, which are 2:1 multiplexers, select outputs from either their corresponding accumulator 560 or the preceding accumulator 560. For instance, the second multiplexer 530 selects outputs from either the second accumulator 560 or the first accumulator 560. That allows the sum of partial products, in other words the intermediate outputs, of the accumulators 560 to be "rippled down" during every output sample index. However, the re-sampler 500 does not generate output samples y(n) for every $9^{th}$ input sample index, for instance for the output sample corresponding to the input sample x(m+8). The last accumulator 560 provides the final output sample to the flip-flop 570. The flip-flop 570 provides samples at the equivalent output clock rate $f_{out}$.

FIG. 6 is a table 600 of coefficient indices for the multipliers 540 in the re-sampler 500 in FIG. 5. The table 600 assumes L=63 filter coefficients and a re-sampling ratio M/N=8/9. Thus, P=⌈L/N⌉=⌈63/9⌉=⌈7⌉=7, so there are 7 multipliers 540 as denoted by multiplier 1 to multiplier 7. The partial products that correspond to each of the output samples have the same hatching scheme. For instance, the partial products 61 for multiplier 1, 53 and 45 for multiplier 2, 37 for multiplier 3, 29 for multiplier 4, 21 for multiplier 5, 13 for multiplier 6, and 5 for multiplier 7 correspond to output sample y(n+5).

When the re-sampler 500 does not generate a final output sample, for instance for the output sample corresponding to the $N^{th}$ input sample, the select signal of the multiplexers 530 is 1, which causes the re-sampler 500 to retain the sum of partial products in their streams. For all other input samples, the select signal for the multiplexers 530 is 0, which causes the re-sampler 500 to ripple down the sum of partial products. One of the inputs to the first multiplexer 530 is 0, which ensures that the output of the first flip-flop 580 is reset when the first partial product corresponding to a new output sample needs to be computed. The multipliers 540 cycle through a different set of only N=9 coefficients, and the entire coefficient selection and multiplexer selection repeats after N input sample instances. In other words, each multiplier 540 uses a different set of N coefficients, and all of the sets of N coefficients make up a total of L coefficients. The index k, which the multiplexers use to select the coefficients $\{h_{(P-1)N+k}, h_{(P-2)N+k}, \ldots, h_k\}$ for the multipliers 540, periodically takes values from (0, 1, ..., N−1).

Figure 7:
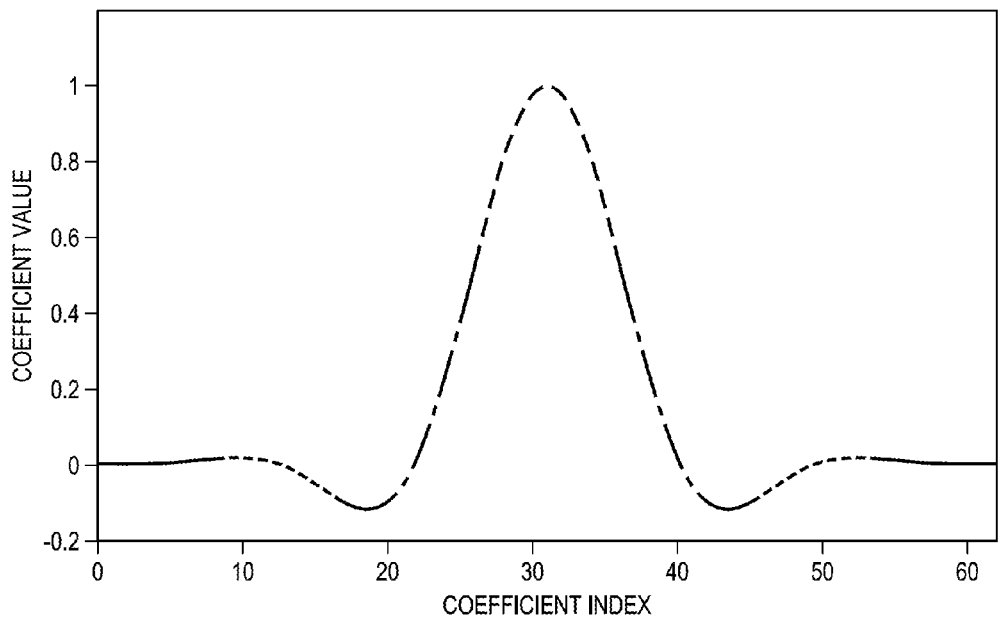
FIG. 7 is a graph of coefficient values for the re-sampler in FIG. 5.

FIG. 7 is a graph 700 of coefficient values for the re-sampler 500 in FIG. 5. The x-axis represents coefficient index values in constant units, and the y-axis represents coefficient values in constant units. Each set of coefficients handled by the multipliers 540 has a different line scheme.

Each multiplier 540 of the re-sampler 500 handles N consecutive filter coefficients, instead of all L coefficients. As shown in the graph 700, the edge set of coefficients may have a lower magnitude compared to the middle set of coefficients. That is because the up-sampling in the re-sampler 500 may have a low-pass characteristic. The re-sampler 500 may exploit that characteristic to reduce the precision of one of the multiplicands in the edge multipliers 540. For instance, multiplier 1 and multiplier 7 may need to support only 8-bit precision for the coefficients, while multiplier 2 and multiplier 6 support 12-bit coefficient precision, multiplier 3 and multiplier 5 support 14-bit coefficient precision, and multiplier 4 supports 15-bit coefficient precision. However, all of the multipliers 540 may have the same input sample precision of, for instance, 16.

Although re-samplers 300, 500 are described as implementing a digital clock that equals the input sampling rate $f_{in}$, the re-samplers 300, 500 may implement a digital clock that equals $f_{in}/2$. In that case, the re-samplers 300, 500 may have parallel components, handle two input samples every input clock cycle, and combine the input samples. The control logic of the re-samplers 300, 500 may be modified to handle the parallelization.

As a first alternative, the re-sampler 200 may be modified to operate at the input clock rate $f_{in}$ by gating off N-M clocks out of every N. However, the average clocking rate of the digital logic would still be equivalent to $f_{out}$. As a second alternative, the re-samplers 300, 500 may clocked at the input clock rate $f_{in}$ by performing dummy computations for N-M clocks when no output samples are needed. However, that approach may increase power consumption by a factor of N/M, for instance 50% for M/N=2/3.

Figure 8:
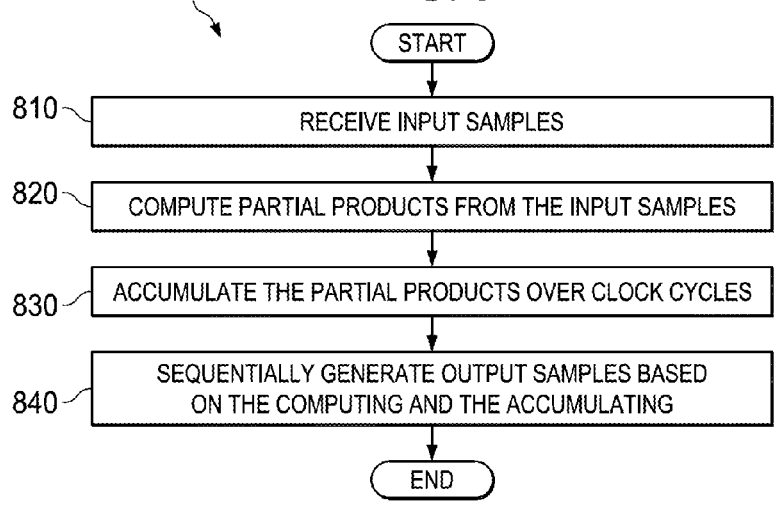
FIG. 8 is a flowchart illustrating a method of analog-digital compatible re-sampling according to an embodiment of the disclosure.

FIG. 8 is a flowchart illustrating a method 800 of analog-digital compatible re-sampling according to an embodiment of the disclosure. The re-samplers 300, 500 may perform the method 800. At step 810, input samples are received. For instance, the multipliers 330, 540 receive the input samples. At step 820, partial products are computed from the input samples. For instance, the multipliers 330, 540 compute the partial products. At step 830, the partial products are accumulated over clock cycles. For instance, the accumulators 350, 560 accumulate the partial products. The accumulators 350, 560 may store the partial products in the flip-flops 360, 580. Finally, at step 840, output samples are sequentially generated based on the computing and the accumulating. For instance, the multiplexer 370 sequentially generates the output samples or the multiplexers 530 sequentially generate the output samples from the bottom stream of the accumulators 560 and provide the output samples to the flip-flop 570. Steps 820, 830, and 840 are performed at an input clock rate $f_{in}$.

A first component is directly coupled to a second component when there are no intervening components, except for a line, a trace, or other medium between the first component and the second component. The first component is indirectly coupled to the second component when there are intervening components other than a line, a trace, or another medium between the first component and the second component. The termed "coupled" and its derivatives includes both directly coupled and indirectly coupled.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A digital re-sampler comprising:
   a plurality of multipliers configured to receive an input sample; and
   a plurality of accumulators coupled to the multipliers and configured to form multiplier-accumulator (MAC) units with the multipliers,
   wherein the MAC units are configured to:
      compute partial products from the input sample,
      accumulate the partial products over clock cycles, and
      sequentially generate output samples based on the computation of partial products and the accumulation of partial products over clock cycles and
      wherein the MAC units operate at input clock rate $f_{in}$; and
   wherein the re-sampler is an M/N re-sampler, wherein M is an up-sampling rate, and wherein N is a down-sampling rate and wherein M and N are integers.

2. The re-sampler of claim 1, wherein the re-sampler does not comprise a tap delay configured to receive the input sample.

3. The re-sampler of claim 1, wherein the plurality of multipliers are further configured to scale the input sample with L coefficients, and wherein L is a positive integer.

4. The re-sampler of claim 3, further comprising:
   a coefficient look-up table (LUT) coupled to the plurality of multipliers; and
   a coefficient index generator coupled to the coefficient LUT and configured to provide coefficient indices to the plurality of multipliers.

5. The re-sampler of claim 3, further comprising a multiplexer coupled to the MAC units and configured to select the output samples from the MAC units, wherein the multiplexer is a P:1 multiplexer, and wherein P is a positive integer.

6. The re-sampler of claim 5, further comprising a flip-flop coupled to the multiplexer and configured to provide final outputs.

7. The re-sampler of claim 5, wherein P =⌈L/N⌉, and wherein ⌈ ⌉ represents a ceiling operation that computes a nearest integer that is higher than a value of L/N.

8. A digital re-sampler comprising:
   a first multiplier configured to receive input samples;
   a first accumulator coupled to the first multiplier and configured to form a first multiplier-accumulator (MAC) unit with the first multiplier;
   a first multiplexer coupled to the first MAC unit and comprising:
      a first input configured to receive an input of 0, and
      a second input coupled to the first accumulator;
   a second multiplier configured to receive the input samples;
   a second accumulator coupled to the second multiplier and configured to form a second MAC unit with the second multiplier; and
   a second multiplexer coupled to the second MAC unit and comprising:
      a third input coupled to the first accumulator, and
      a fourth input coupled to the second accumulator.

9. The re-sampler of claim 8, wherein the re-sampler is an M/N re-sampler, wherein M is an up-sampling rate, and wherein N is a down-sampling rate wherein M and N are integers, and wherein the first multiplier and the second multiplier are configured to scale the input samples with N coefficients.

10. The digital re-sampler of claim 8, further comprising:
    a coefficient look-up table (LUT) coupled to the first multiplier and the second multiplier; and
    a coefficient index generator coupled to the coefficient LUT and configured to provide coefficient indices to the first multiplier and the second multiplier.

11. The digital re-sampler of claim 8, wherein the re-sampler does not comprise a tap delay configured to receive the input samples, wherein the input samples comprise a first input sample, and wherein the first multiplier and the second multiplier are configured to receive the first input sample.

12. The digital re-sampler of claim 8, wherein the first MAC unit and the second MAC unit are configured to operate at an input clock rate $f_{in}$.

13. The digital re-sampler of claim 8, further comprising:
    a first flip-flop coupled to the first multiplexer and the first accumulator; and
    a second flip-flop coupled to the second multiplexer and the second accumulator.

14. The digital re-sampler of claim 8, wherein the first multiplexer and the second multiplexer are 2:1 multiplexers.

15. A method of operating a digital re-sampler comprising:
    receiving input samples at multiplier-accumulator (MAC) units;
    computing partial products from the input samples in the MAC units;
    accumulating the partial products over clock cycles in the MAC units; and
    sequentially generating output samples based on the computation of partial products and the accumulation of partial products over clock cycles; and
    wherein the computing, the accumulating, and the generating are performed at an input clock rate $f_{in}$; and
    further comprising re-sampling at a re-sampling ratio of M/N, wherein M is an up-sampling rate, and wherein N is a down-sampling rate and wherein M and N are integers.

16. The method of claim 15, further comprising:
    scaling the input samples with L coefficients, wherein L is a positive integer; and
    selecting, using a P:1 multiplexer, the output samples from a plurality of
    multiplier-accumulator (MAC) units, wherein P is a positive integer, wherein P=⌈L/N⌉, and wherein ⌈ ⌉ represents a ceiling operation that computes a nearest integer that is higher than a value of L/N.

17. The method of claim 15, further comprising:
    scaling, by each of a plurality of P multipliers, the input samples with a different set of N coefficients, wherein P is a positive integer, wherein all of the sets of N coefficients make up a total of L coefficients, and wherein L is a positive integer; and
    selecting, using P 2:1 multiplexers, the output samples from the multiplier-accumulator (MAC) units, wherein P =⌈L/N⌉, and wherein ⌈ ⌉ represents a ceiling operation that computes a nearest integer that is higher than a value of L/N.

* * * * *